US012796007B2

(12) United States Patent
Bolotnikov et al.

(10) Patent No.: US 12,796,007 B2
(45) Date of Patent: Nov. 10, 2026

(54) SELF-ALIGNED JFET DEVICE

(71) Applicant: SEMICONDUCTOR COMPONENTS INDUSTRIES, LLC, Phoenix, AZ (US)

(72) Inventors: Alexander Viktorovich Bolotnikov, Niskayuna, NY (US); Jimmy Robert Hannes Franchi, Enkoeping (SE); Krister Gumaelius, Vaxholm (SE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 944 days.

(21) Appl. No.: 18/066,738

(22) Filed: Dec. 15, 2022

(65) Prior Publication Data

US 2024/0204111 A1 Jun. 20, 2024

(51) Int. Cl.

| | |
|---|---|
| ***H10D 30/83*** | (2025.01) |
| ***H10D 12/01*** | (2025.01) |
| ***H10D 62/832*** | (2025.01) |
| ***H10P 30/22*** | (2026.01) |

(52) U.S. Cl.

CPC ......... *H10D 30/831* (2025.01); *H10D 12/031* (2025.01); *H10D 62/8325* (2025.01); *H10P 30/22* (2026.01)

(58) Field of Classification Search

CPC ............. H10D 30/831; H10D 30/0515; H10D 62/343; H01L 21/0465; H01L 21/046

See application file for complete search history.

(56) References Cited

U.S. PATENT DOCUMENTS

| | | | |
|---|---|---|---|
| 5,196,358 | A | 3/1993 | Boos |
| 8,519,410 | B1 | 8/2013 | Odekirk et al. |
| 2002/0047124 | A1 | 4/2002 | Kitabatake |
| 2003/0089930 | A1 | 5/2003 | Zhao |
| 2005/0006649 | A1 | 1/2005 | Iwasaki |

(Continued)

FOREIGN PATENT DOCUMENTS

| | | | |
|---|---|---|---|
| FR | 2303383 | A1 | 10/1976 |
| JP | S6177372 | A | 4/1986 |

(Continued)

OTHER PUBLICATIONS

Giacomini, G. et al, "Fabrication and electrical characterization of High-Voltage silicon JFETs", Journal of Instrumentation, Institute of Physics Publishing, Bristol, GB, vol. 14, No. 5, May 8, 2019, 15 pages. (Year: 2019).*

(Continued)

*Primary Examiner* — Wasiul Haider

(74) *Attorney, Agent, or Firm* — Brake Hughes Bellermann LLP

(57) ABSTRACT

A JFET transistor device having a reduced pitch may be manufactured using self-alignment techniques, while avoiding misalignments that may lead to decreased breakdown voltage and/or increased $R_{DSon}$. Consequently, described devices provide, for a given active area and gate voltage, additional current channels, increased current, and reduced $R_{DSon}$, as compared to conventional devices, while retaining high $BV_{gs}$ values.

22 Claims, 21 Drawing Sheets

(56) References Cited

U.S. PATENT DOCUMENTS

| | | | | |
|---|---|---|---|---|
| 2008/0230812 | A1* | 9/2008 | Disney | H10D 30/663 257/E29.054 |
| 2014/0061647 | A1 | 3/2014 | Werner | |
| 2015/0236089 | A1 | 8/2015 | Kagotoshi et al. | |
| 2017/0213917 | A1 | 7/2017 | Bhalla et al. | |
| 2018/0122931 | A1* | 5/2018 | Siemieniec | H10D 84/144 |
| 2022/0020874 | A1 | 1/2022 | Fisher et al. | |
| 2023/0098516 | A1* | 3/2023 | Pala | H10D 30/831 257/77 |

FOREIGN PATENT DOCUMENTS

| | | | |
|---|---|---|---|
| JP | 2002043332 | A | 2/2002 |
| WO | 20180187651 | A1 | 10/2018 |

OTHER PUBLICATIONS

Asano, et al., "SKV 4H—SiC SEJFET with Low RonS of 69mΩm2", Proceedings of th 14th International Symposium on Power Semiconductor Devices and Ics; IEEE, 2002, pp. 61-64.

International Search Report and Written Opinion for PCT Application No. PCT/US2023/075684, mailed on Jul. 5, 2024, 20 pages.

International Search Report for counterpart application No. PCT/US2023/082651, mailed Apr. 4, 2024, 12 pages.

Giacomini G. et al, "Fabrication and electrical characterization of High-Voltage silicon JFETS," Journal of Instrumentation, Institute of Physics Publishing, Bristol, GB, vol. 14, No. 5, May 8, 2019, 15 pages.

* cited by examiner

SELF-ALIGNED JFET DEVICE

TECHNICAL FIELD

This description relates to semiconductor devices.

BACKGROUND

In many transistor-based devices, multiple transistor cells are connected within an active area of a device. Each individual transistor cell may be considered as a unit cell of the overall device, and a width of a unit cell may be referred to as a pitch of the device. Operational aspects of the overall device may be dictated by characteristics of the individual transistors included therein, as well as by aggregated or composite characteristics of the multiple transistor cells within the active area.

For example, an on-state resistance of a transistor, also referred to as a source-drain on-state resistance, or $R_{DSon}$, may indicate an amount of current (e.g., drain current or Id) that exists for a corresponding drain voltage (e.g., a drain-source voltage, or Vds). A gate-source breakdown voltage, or BVgs, may refer to a reverse voltage at which the transistor exhibits a sudden rise of reverse current while the transistor is in an off-state.

Reducing the size of each unit cell (i.e., reducing the pitch) of the transistor device within a given active area provides more individual transistor cells within the active area, and is therefore conceptually correlated with (for a given gate voltage) additional current channels, increased current, and reduced $R_{DSon}$. However, reducing the device pitch to a desired level may be difficult or impossible using conventional techniques. Moreover, attempting to reduce the pitch of conventional device structures may lead to undesired consequences if any misalignment occur. For example, such misalignment may result in deteriorated performance, (e.g., reduced BVgs or higher $R_{DSon}$ of the overall device as well as yield reduction and diminished reliability.

SUMMARY

According to one general aspect, a Junction Field Effect Transistor (JFET) semiconductor device may include a substrate including a drain region of the JFET, a drift region disposed on the substrate, and a lower gate disposed on the drift region. The JFET semiconductor device may include a source region having a lower source region that is disposed on the lower gate and extends laterally beyond the lower gate, and an upper source region disposed on the lower source region, and an upper gate formed on the lower source region and at least partially surrounding the upper source region, and extending laterally beyond the lower gate to define a gate offset between the upper gate and the lower gate.

According to another general aspect, a Junction Field Effect Transistor (JFET) semiconductor device may include a substrate including a drain region of the JFET semiconductor device, a drift region disposed on the substrate, and a plurality of unit cells disposed on the drift region in a grid. Each unit cell may include a lower gate disposed on the drift region, a source region having a lower source region that is disposed on the lower gate and extends laterally beyond the lower gate, and an upper source region disposed on the lower source region, and an upper gate formed on the lower source region and at least partially surrounding the upper source region, and extending laterally beyond the lower gate to define a gate offset between the upper gate and the lower gate.

According to another general aspect, a method of making a semiconductor device may include forming a lower source region implant and an upper gate implant through a first opening in a mask disposed on a substrate, forming a first spacer on sidewalls of the mask to define a second opening that is smaller than the first opening, and forming a lower gate through the second opening. The method may include forming a second spacer on the first spacer to define a third opening that is smaller than the second opening, and forming an upper source region through the third opening and within the upper gate implant to thereby define a remainder of the upper gate implant as an upper gate of a Junction Field Effect Transistor (JFET) with the substrate providing a drain of the JFET.

The details of one or more implementations are set forth in the accompanying drawings and the description below. Other features will be apparent from the description and drawings, and from the claims.

DETAILED DESCRIPTION

The present disclosure relates to a JFET transistor device having a reduced pitch, e.g., less than 5 microns. The JFET transistor device may be manufactured using self-alignment techniques that enable a device pitch that is smaller than can be obtained using conventional mask-based photolithography techniques, while avoiding misalignments that may lead to decreased BV and/or increased $R_{DSon}$. Consequently, described devices provide (for a given active area and gate voltage) additional current channels, increased current, and reduced $R_{DSon}$, as compared to conventional devices, while retaining acceptable BV values.

Figure 1:
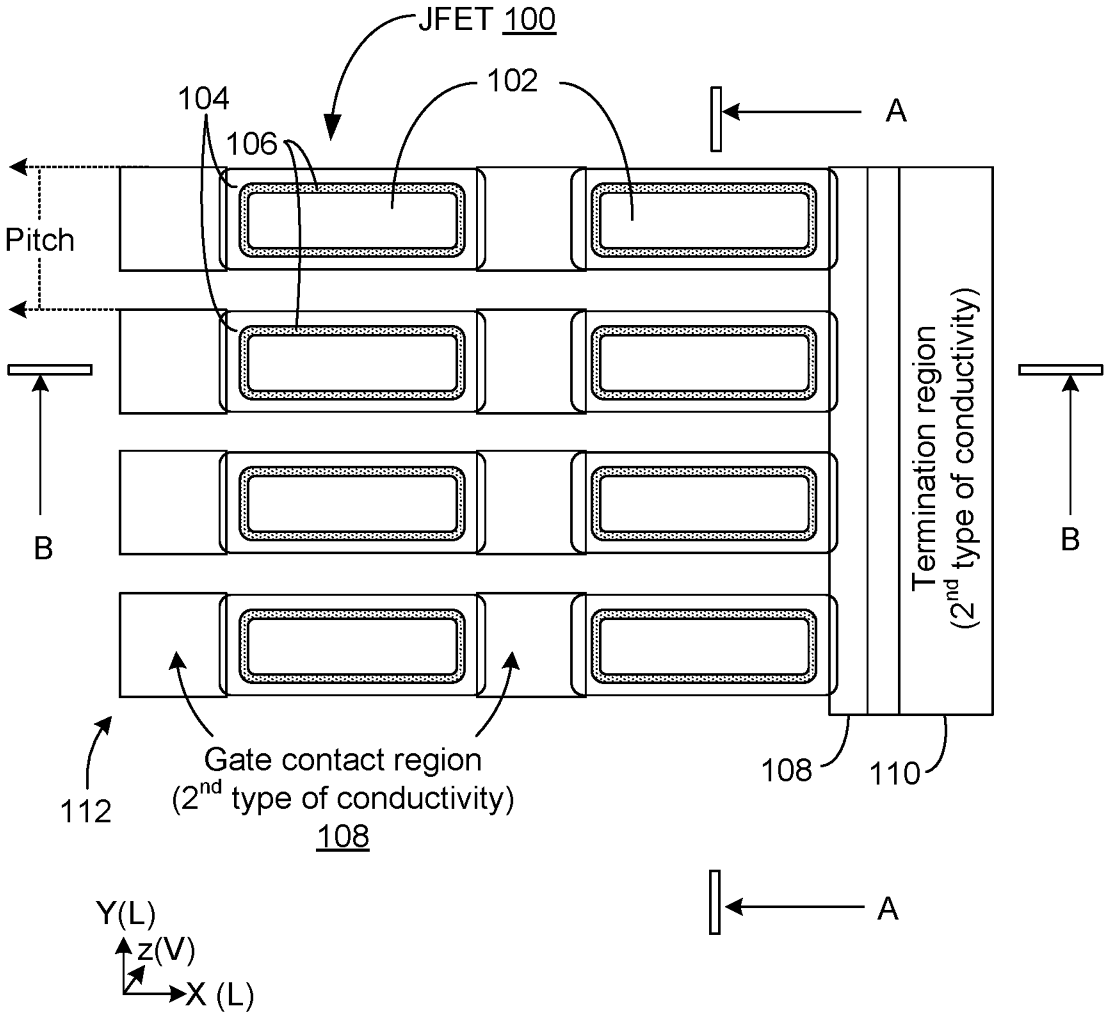
FIG. 1 illustrates a top view of a self-aligned JFET device.

FIG. 1 illustrates a top view of a self-aligned JFET device that includes a plurality of individual JFET device cells, each referenced herein as JFET 100. In the example of FIG. 1, a plurality or grid of source regions 102 of a first conductivity type (e.g., n-type) are each illustrated as being at least partially surrounded by a low-doped BVgs-enhancing region(s) 106 of the first conductivity type. That is, the BVgs enhancing region(s) 106 should be understood to have a doping that is lower than a doping of the source region(s) 102, as explained in more detail, below. For example, the BVgs enhancing region 106 may have a doping level that is twenty percent or less, e.g., 10 percent or 15 percent, of a doping of the source region 102.

Each BVgs-enhancing region 106 is at least partially surrounded by an upper gate 104 of a second conductivity type (e.g., p-type). Not visible in the top view of FIG. 1, but shown and described in detail, below, e.g., with respect to FIGS. 2-5, is a lower gate (e.g., lower gate 204 in FIG. 2). In other words, in the top view of FIG. 1, the upper gate 104, the BVgs enhancing region 106 and source region 102 are vertically above, and obscure a view of, the lower gate (e.g., the lower gate 204 of FIG. 2).

In the present description, the vertical direction V refers to a z-axis that connects, and is perpendicular to, planar surfaces of the upper gate 104 and the lower gate 204, and of an underlying substrate (e.g., the substrate 206 of FIG. 2), so that the vertical direction V extends into the paper in FIG. 1. A lateral direction L refers to a direction that is perpendicular to the vertical direction V, along either an x-axis and/or a y-axis.

As illustrated and explained in detail, below, the structure of FIG. 1 thus forms the JFET 100 in which a current channel is formed between the upper gate 104 and the lower gate 204. Current thus flows from the source region(s) 102, initially in a lateral direction between the upper gate 104 and the lower gate 204, and then in a vertical direction into the paper of FIG. 1 and to a drain of the JFET device of FIG. 1 (e.g., drain 208 of FIG. 2, not visible in the top view of FIG. 1).

To control this current flow, gate contacts 108 of the second conductivity type are formed that are connected to both the upper gate 104 and to the lower gate 204. Accordingly, a single common gate voltage may be applied to control all of the individual JFET cells 100 of the JFET device of FIG. 1.

Further in FIG. 1, a termination region 110 of the second conductivity type is defined adjacent to an active area 112 in which the various JFET cells are formed. It will be appreciated that FIG. 1 is a partial view of the active area 112 and the termination region 110. In example implementations, the termination region 110 completely surrounds the active area 112. For example, the termination region 110 may define an outer perimeter of the active area 112. In some implementations, the termination region 110 may include implants and/or trench structures to terminate electricals fields associated with operation of the various JFETs within the active area 112 of the semiconductor device of FIG. 1. Thus, the termination region 110 may help maintain breakdown voltage of the JFETs of FIG. 1 close to the maximum BV limited by material properties. For instance, the termination region 110 can prevent breakdown from occurring below a rated voltage of the JFET(s) 100, e.g., by terminating high electric fields during JFET operation.

Thus, in FIG. 1, each JFET cell 100 defines a unit cell of the JFET device, with lines of unit cells extending in the x-direction. As illustrated in FIG. 1, a pitch of the JFET device may be defined as a distance along the y-axis between adjacent lines of unit cells, or, alternatively, as a width of a unit cell in the y-direction.

Figure 2:
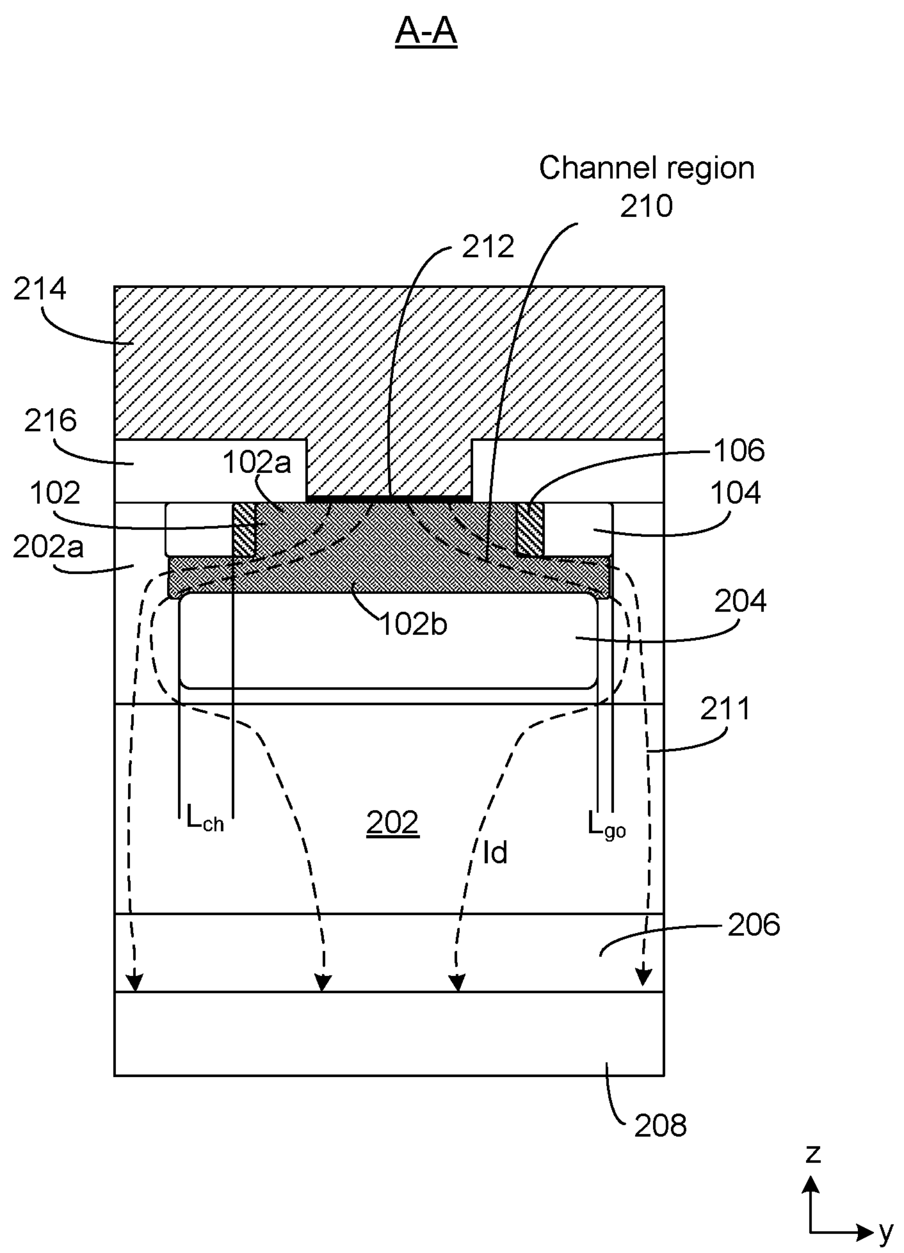
FIG. 2 illustrates a cross sectional view of the self-aligned JFET device of FIG. 1, taken along A-A.
Figure 3:
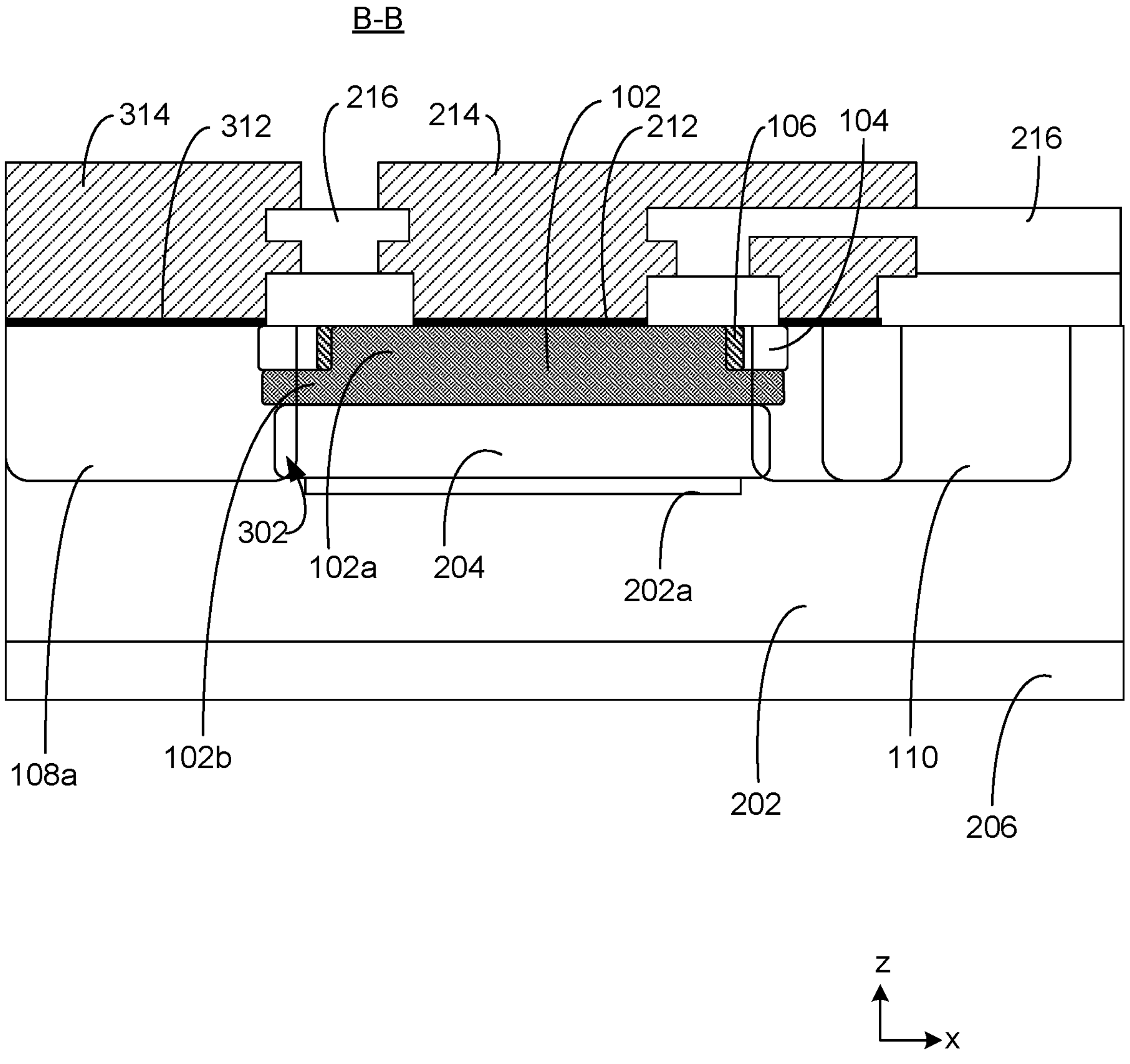
FIG. 3 illustrates a cross sectional view of the self-aligned JFET device of FIG. 1, taken along B-B.

FIG. 1 illustrates cross-sectional lines of view A-A and B-B, where FIG. 2 illustrates a first cross sectional view of a JFET of FIG. 1, taken along A-A (i.e., a cross section taken along the y-axis and looking in the x-direction), and FIG. 3 illustrates a second cross sectional view of a JFET of FIG. 1, taken along B-B (i.e., a cross section taken along the x-axis and looking in the y-direction).

More specifically, in FIG. 2, source region 102 is illustrated as including an upper source region 102*a* and a lower source region 102*b*. As shown, the upper source region 102*a* is at least partially surrounded by the BVgs-enhancing region 106, which is itself at least partially surrounded by the upper gate 104. The lower source region 102*b* extends along the lower gate 204, under the upper gate 104, the BVgs-enhancing region 106, and the upper source region 102*a*, and defines a channel region $L_{ch}$, as described in more detail, below.

Further in FIG. 2, a drain contact 208 has a drain region formed in a substrate 206 of the first type of conductivity (e.g., n-type). A voltage-blocking drift region 202 is formed on the substrate 206, e.g., as an epitaxial layer, and may include a relatively-higher doped region 202*a*. The drift region 202 and the substrate 206 may be formed using, e.g., Silicon Carbide (SiC), Si, Gallium Nitride (GaN), Aluminum Nitride (AlN), or any other semiconductor material.

FIG. 2 further illustrates source metal 214, which is omitted in FIG. 1 for the sake of visibility of the top view. As shown, a source contact 212 facilitates electric contact between the source metal 214 and the source region 102, while a dielectric layer 216 provides insulation between the source metal 214 and the BVgs-enhancing region 106, upper gate 104, and drift region 202.

In operation, application of a certain gate and drain voltage enables current 211 (shown as drain current Id) to flow through the upper source region 102*a*, laterally through a channel region $L_{ch}$, and vertically through the drift region 202 to the drain substrate 206. More specifically, as illustrated, the channel region $L_{ch}$ may be defined in a lateral direction between an inner edge of the upper gate adjacent to the BVgs-enhancing region 106 and an outer edge of the lower gate 204.

Also in FIG. 2, a lateral distance $L_{go}$ refers to a gate offset between the upper gate 104 and the lower gate 204 edges. That is, as shown, an outer edge of the upper gate 104 may extend beyond an outer edge of the lower gate 204 by the distance $L_{go}$. As described in detail, below, e.g., with respect to FIGS. 22 and 23, the gate offset $L_{go}$ prevents a depletion region within the channel $L_{ch}$ from spreading beyond the channel $L_{ch}$, which would have the unintended and undesired effect of turning off the JFET cell 100. For example, when the JFET cell 100 is designed as a normally-on device, a gate offset $L_{go}$ that is too small allows excessive depletion within and beyond the channel $L_{ch}$, and causes the JFET cell 100 to be in an off state. In other words, decreasing $L_{go}$ tends to increase $R_{DSon}$, as illustrated in the example graph of FIG. 23. In some embodiments, the upper gate 104 and the lower gate 204 may not have a structural offset, but may be offset during a fabrication process (e.g., using a designated spacer) to account for wider spread of the lower gate 204. That is, there may be a larger lateral spread of the buried lower gate 204, which is formed using higher ion implantation energy as compared to the energy used for the ion implantation of the upper gate 104. In example implementations, the spacer width, and thus the resulting offset, may be as small as 0 um (no offset) or as large as 0.7 um.

FIG. 2 further illustrates the positioning of the BVgs-enhancing region 106 between the upper gate 104 and the upper source region 102*a*. Thus, the BVgs-enhancing region 106 prevents contact between the relatively higher-doped upper source region and the relatively higher-doped upper gate 104, allowing for a higher source doping that enables a reduction of the source contact resistivity comparing to what is possible in a device without the BVgs enhancing region. Contact between the two high-doped regions 102*a*, 104 may otherwise result in a lower BVgs for the JFET 100. However, by including the BVgs-enhancing region 106 as shown, contact between the two high-doped regions 102*a*, 104 is prevented, and the BVgs of the device is increased.

FIG. 3 illustrates a cross sectional view of the self-aligned JFET device of FIG. 1, taken along B-B. In the example of FIG. 3, gate contact 312 and gate metal 314 (omitted in FIG. 1 for the sake of visibility of the top view) are illustrated as being positioned to enable electrical contact with both the upper gate 104 and the lower gate 204, using gate contact region 108*a*. Insulating dielectric layer(s) 216 are further illustrated as providing insulation between the source metal 214 and the gate metal 314.

In the example of FIG. 3, the gate contact region 108*a* includes an overlap region 302 that partially overlaps with the upper gate 104, the channel region, and the lower gate 204. For example, the gate contact region 108*a* may partially overlap the upper gate 104 and the channel region by a distance that is less than a channel length of the JFET 100 ($d<L_{ch}$) thus not contacting the higher-doped portion of the source region.

Figure 4:
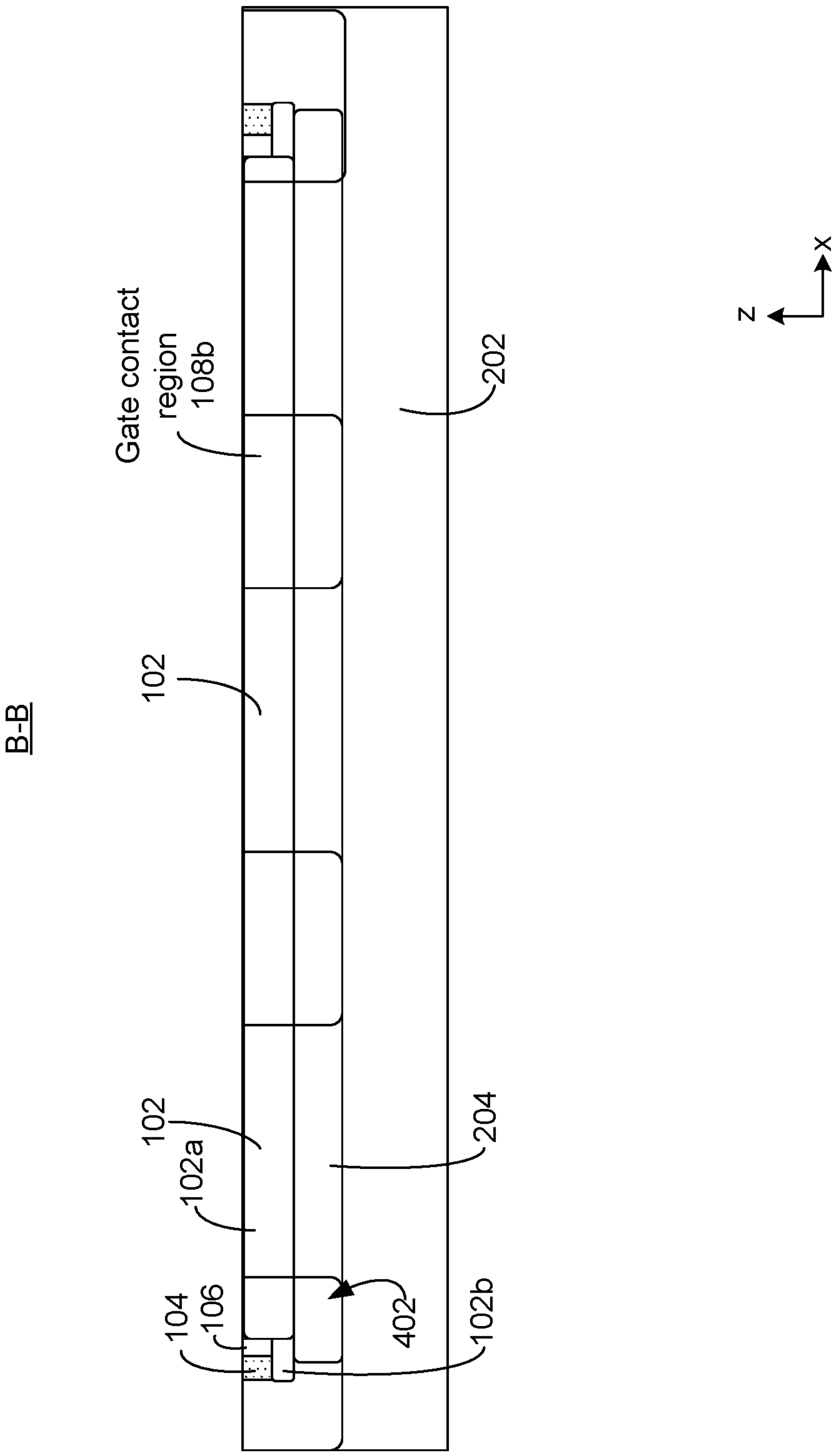
FIG. 4 illustrates a cross sectional view of a first alternate implementation of the self-aligned JFET device of FIG. 1, taken along B-B.

In the example of FIG. 4, an alternate implementation of the gate contact region 108, shown as gate contact region 108*b*, is embedded into the JFET cell 100 (i.e., into the JFET cell) to define an overlap region 402. More specifically, as shown, the gate contact region 108*b* defines the overlap region 402 as extending past the upper gate 104, the lower source region 102*b*, and the BVgs-enhancing region 106. Thus, the gate contact region 108*b* of FIG. 4 extends through the channel region $L_{ch}$, and into the upper source region 102*a*. In this embodiment the doping in the gate contact region compensates the doping of the source region. While this simplifies the device fabrication process, the source region doping may be limited to avoid a deterioration of the BVgs.

Figure 5:
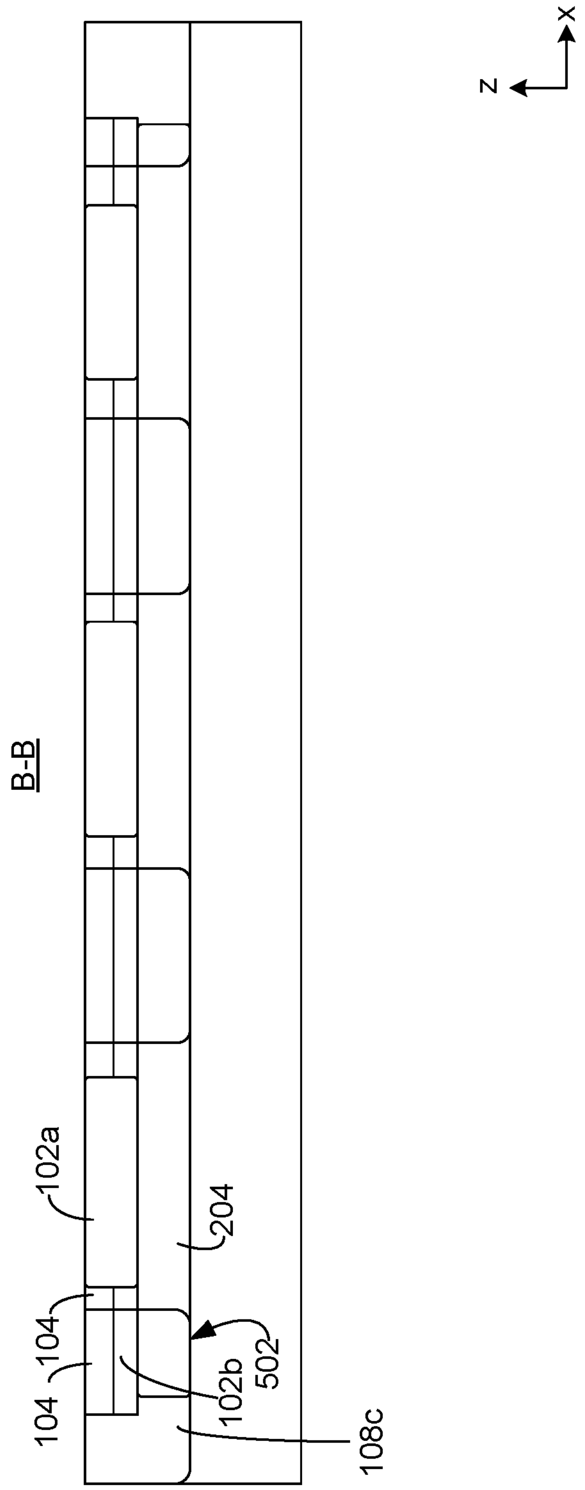
FIG. 5 illustrates a cross sectional view of a second alternate implementation of the self-aligned JFET device of FIG. 1, taken along B-B.

In the alternate example of FIG. 5, the gate contact region 108*c* extends into the upper gate 104, the lower gate 204, and the lower source region 102*b*, without extending into the upper source region 102*a*, to define an overlap region 502. In other words, the gate contact region 108*c* is embedded into the extended JFET cell with no overlap with the upper source region 102*a*. For example, a distance between the gate contact region 108*c* and the upper source region 102*a* may be between 0.5 um and 5 um.

Thus, the gate contact region 108*c* extends into the channel $L_{ch}$. However, in the example of FIG. 5, the BVgs-enhancing region 106 is not included, and the gate contact region 108*c* may extend further into each JFET cell and closer to the upper source region 102*a*, as compared, e.g., to the example of FIG. 4. In the example of FIG. 5, gate-source leakage may be reduced by the illustrated structure, in which the upper source region 102*a* does not overlap with the gate contact region 108*c* (i.e., the overlap region 502 does not extend into the upper source region 102*a*).

Figure 6:
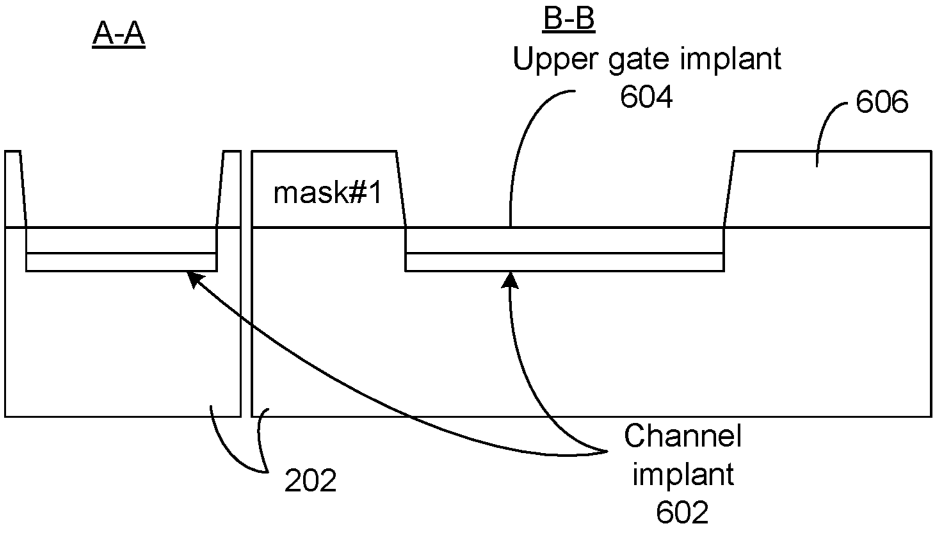
FIG. 6 illustrates a first cross-sectional view of a manufacturing process for manufacturing the self-aligned JFET of FIG. 1.

FIGS. 6-12 illustrate cross-sectional views of example stages of a manufacturing process for manufacturing the self-aligned JFET structure of FIG. 1. In the example of FIG. 6, the drift region 202 of FIG. 2 is processed using a first mask 606. As shown, the first mask 606 may be used to define an opening through which a channel implant 602 and an upper gate implant 604 may be formed. For example, the first mask 606 may be formed using $SiO_2$, polysilicon, Silicon Nitride (e.g., $Si_3N_4$), or combinations thereof. The opening defined by the mask 606 may be, e.g., 4.5 microns or less.

The channel implant 602 and the upper gate implant 604 may be formed using ion implantation or any suitable technique. As will be apparent from the following description, the channel implant 602 may be used to form the lower source region 102*b* of FIGS. 1-5, and the upper gate implant 604 may be used to form the upper gate 104 of FIGS. 1-5.

Figure 7:
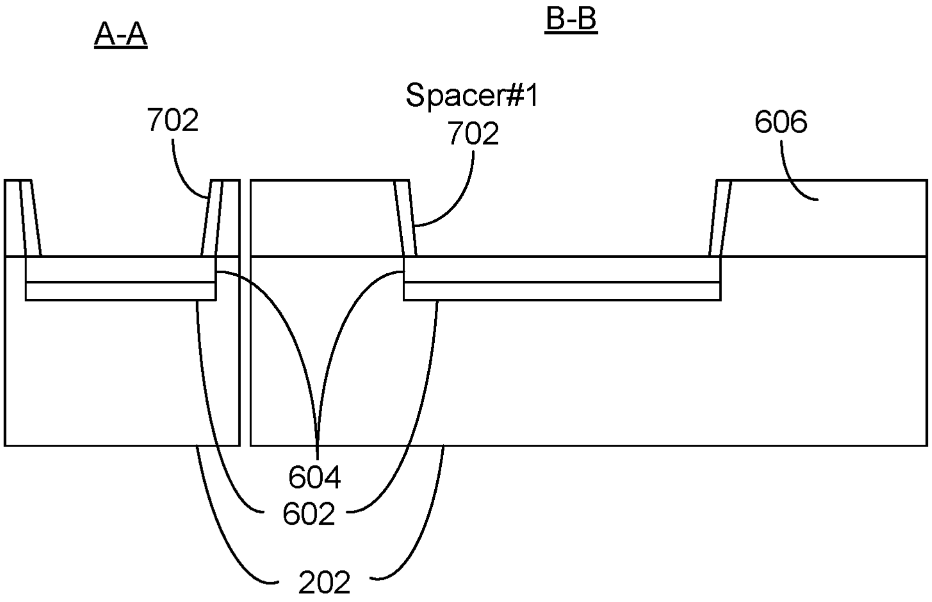
FIG. 7 illustrates a second cross-sectional view of a manufacturing process for manufacturing the self-aligned JFET of FIG. 1.
Figure 8:
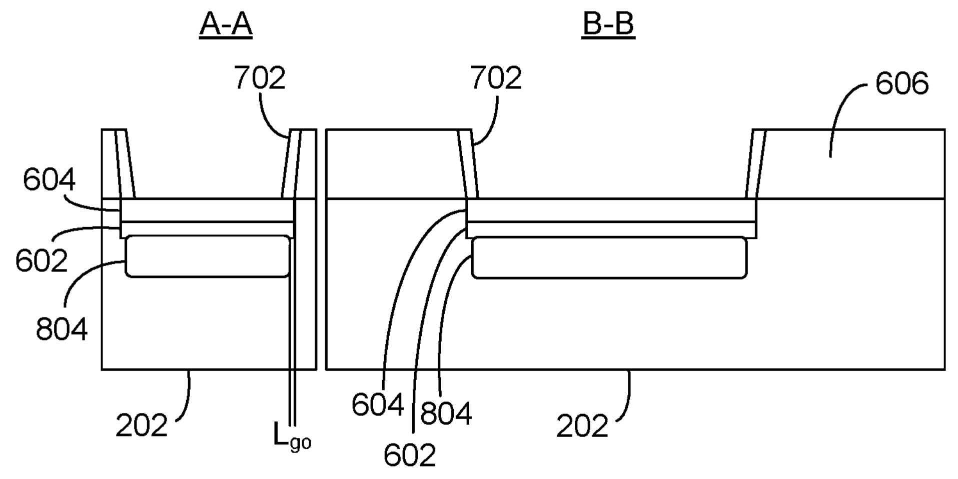
FIG. 8 illustrates a third cross-sectional view of a manufacturing process for manufacturing the self-aligned JFET of FIG. 1.

In FIG. 7, a first spacer 702 is formed on sidewalls of the first mask 606. Techniques for forming the first spacer 702 (and subsequent spacers) are described below, e.g., with respect to FIGS. 13A-13C. The first spacer 702 thereby define a self-aligned mask (which may be referred to as the second mask) that enables formation of lower gate 804, as shown in FIG. 8. For example, local ion implantations utilizing the first spacer 702 as a second mask may be used to form the lower gate 804.

Because the first spacers 702 effectively cause the opening in the first mask 606 to be smaller than in the operations of FIG. 6, if needed the lower gate 804 may be offset from the upper gate 604 by the gate offset $L_{go}$, described above with respect to FIG. 2. Thus, it will be appreciated that controlling a thickness of the first spacer 702 consequently controls or influences an extent of the gate offset $L_{go}$.

In more detail, formation of the lower gate 804 may require, or result in, relatively high energy dopants under the channel implant 602. Consequently, it is possible for these high-energy dopants to diffuse laterally following formation (e.g., implantation) of the lower gate 804. As referenced above, and described in detail, below, with respect to FIGS. 22A, 22B, and 23, such diffusion may result in expansion of the lower gate 804 and corresponding reduction of $L_{go}$. In such cases, a depletion of the channel $L_{ch}$ may extend beyond the lower gate 804, and current through the channel may be prevented. Therefore, formation of the spacer 702 and the lower gate 804 may be calibrated to ensure that a desired $L_{go}$ is obtained. If expansion of the lower gate 804 is comparable to that of the upper gate 604, some embodiments may omit first spacer formation (that is, the lower gate 804 may be formed using the same mask as the upper gate 604).

Figure 9:
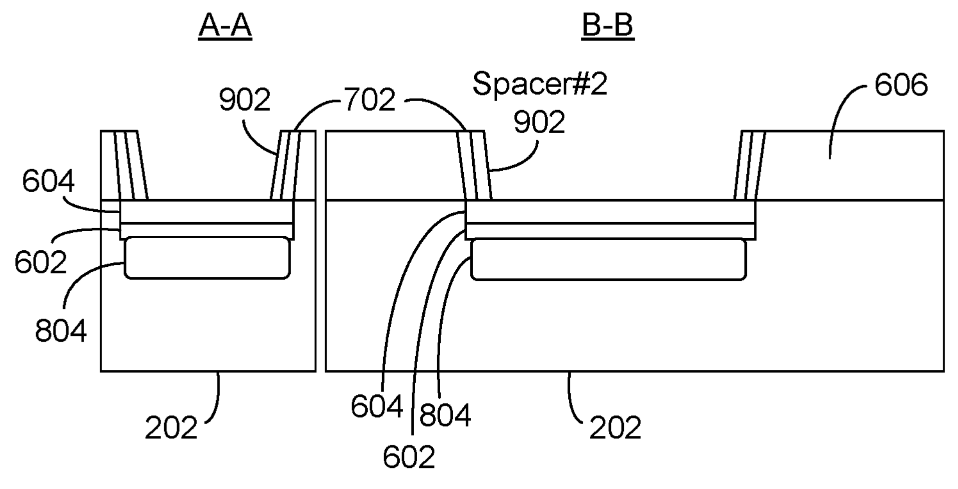
FIG. 9 illustrates a fourth cross-sectional view of a manufacturing process for manufacturing the self-aligned JFET of FIG. 1.

In FIG. 9, a second spacer 902 is formed on sidewalls of the first spacer (second mask) 702, and thereby defines a third mask. Consequently, as shown in FIG. 10, the second spacer 902 may be used to implant (e.g., using local ion implantation) or otherwise form or define a source region portion 1002 and a low-doped region 1006.

Figure 10:
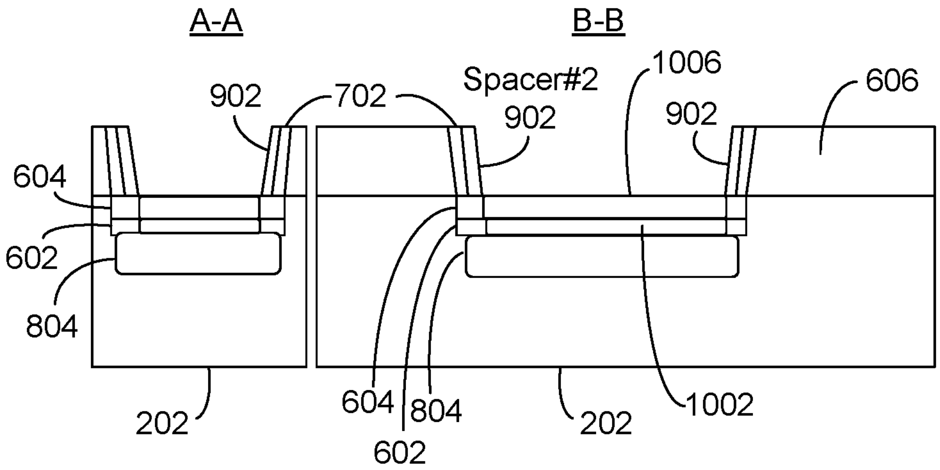
FIG. 10 illustrates a fifth cross-sectional view of a manufacturing process for manufacturing the self-aligned JFET of FIG. 1.

For example, in FIG. 10, the upper gate 604 of the second conductivity type has already been formed, as described above. Using the second spacer 902, implantations of the first conductivity type may be performed to compensate the exposed portions of the upper gate 604 from the second conductivity to the first conductivity at a relatively low doping (i.e., the low-doped region is formed by compensation of the second type of conductivity with doping of the first type of conductivity), while maintaining the source region portion 1002 at a doping level consistent with the existing channel implant source region 602 of FIG. 6.

Figure 11:
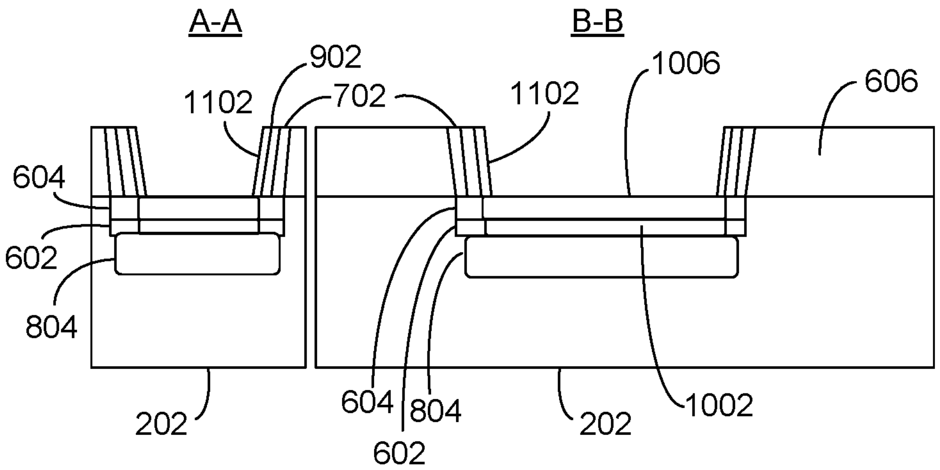
FIG. 11 illustrates a sixth cross-sectional view of a manufacturing process for manufacturing the self-aligned JFET of FIG. 1.
Figure 12:
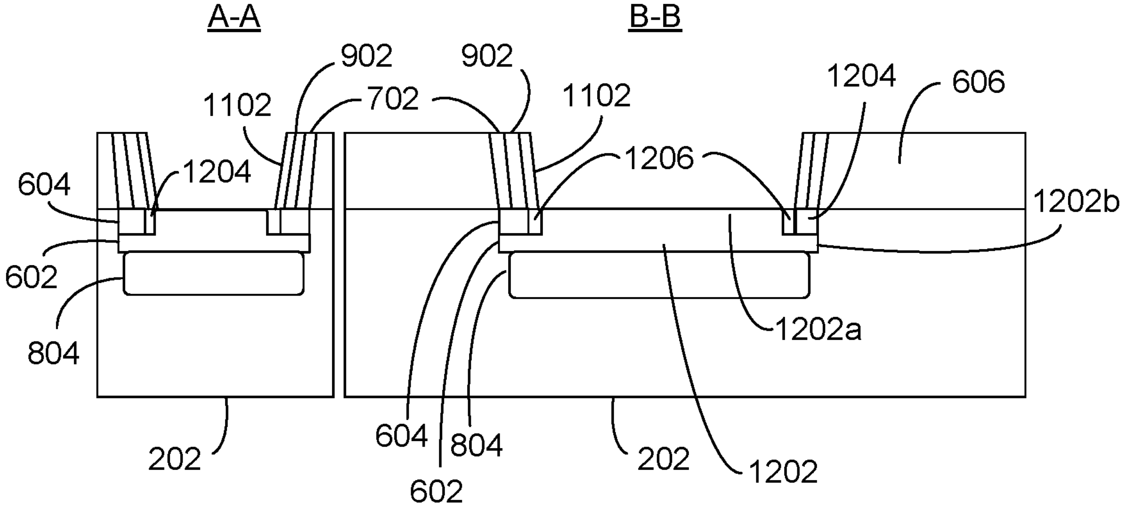
FIG. 12 illustrates a seventh cross-sectional view of a manufacturing process for manufacturing the self-aligned JFET of FIG. 1.

In FIG. 11, a third spacer 1102 is formed on sidewalls of the second spacer (third mask) 902, and thereby defines a fourth mask. Consequently, as shown in FIG. 12, the third spacer 1102 may be used to implant or otherwise form or define upper source region 1202*a*, which, together with lower source region 1202*b* (formed from earlier source regions 602 of FIG. 6 and 1002 of FIG. 10), define source region 1202. At the same time remaining portions of the low-doped region 1006 form BVgs-enhancing region 1206.

Thus, in the examples of FIGS. 6-12, the spacers 702, 902, 1102 effectively form self-aligned masks, so that separate photolithography masks (such as the first mask 606) are not required. Moreover, by using the spacers from preceding manufacturing steps as self-aligned masks in subsequent manufacturing steps, it is possible to form the JFET device(s) of FIGS. 1-5 at a higher degree of precision than is possible using conventional techniques. For example, described techniques do not require consideration of misalignment margins of conventional masks, which may be, e.g., 0.3 microns or more.

For example, the first spacer (second mask) 702 may have a width of up to 0.5 microns. The second spacer (third mask) 902 may have a width of up to 0.5 microns. The third spacer (fourth mask) 1102 may have a width of up to 0.2 microns. The preceding widths are provided for the sake of example, and different widths may be used, as well, and one or more of the spacers/masks 702, 902, 1102 may be omitted. The various spacers/masks 702, 902, 1102 may be formed using, e.g., SiO2, poly-Si, Si3N4, or combinations thereof.

Thus, for example, using the techniques described herein, the pitch of the device of FIG. 1 may be made, e.g., smaller than 5 microns, e.g., 3 microns, or 2 microns, or less. Accordingly, with reference to FIG. 1, the active area 112 may accommodate a larger number of JFET cells (i.e., more of the JFET device cells 100). As a result, as referenced above, and with reference to FIG. 2 and drain current 211, the techniques of FIGS. 6-12 enable more current and reduced $R_{DSon}$, as compared to conventional techniques. A simplified example of a relationship between pitch and $R_{DSon}$ is illustrated and described below, e.g., with respect to FIG. 20.

Figure 13A:
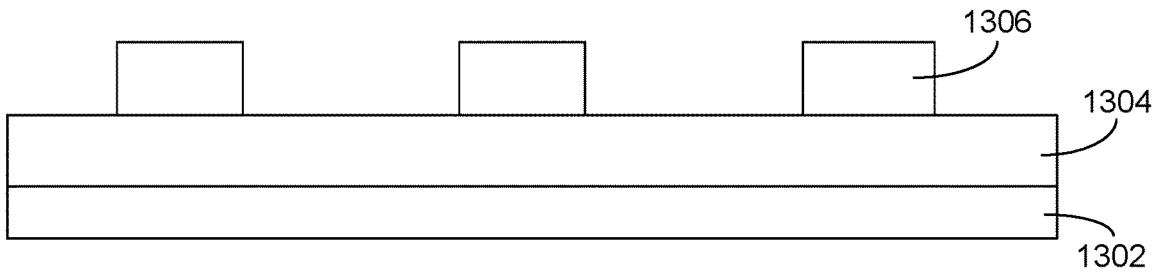
FIGS. 13A-13C illustrate cross-sectional views of an example manufacturing process for providing the spacers used for self-alignment in FIGS. 7, 9, and 11.
Figure 13B:
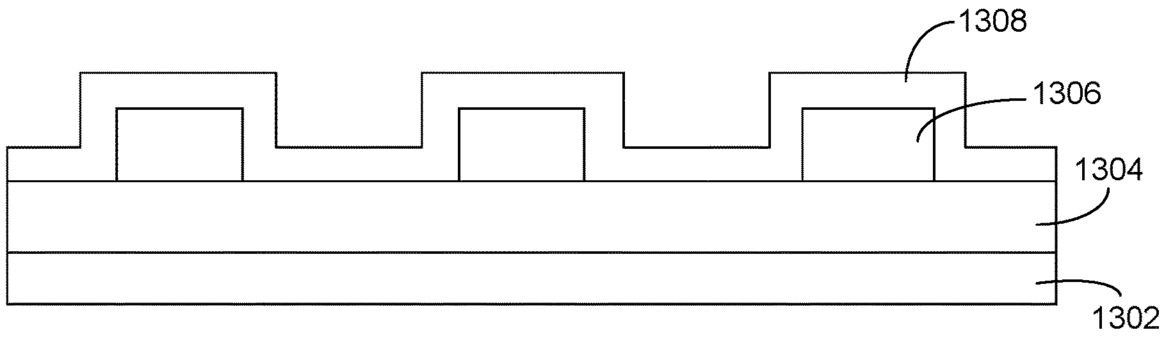
Figure 13C:
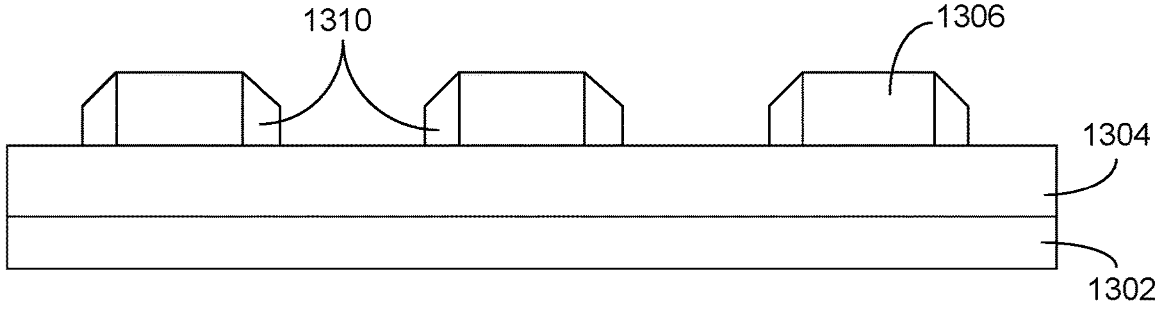

FIGS. 13A-13C illustrate cross-sectional views of an example manufacturing process for providing the spacers used for self-alignment in FIGS. 7, 9, and 11. In FIG. 13A, a mask 1306 is formed on an epitaxial layer 1304, which is formed on a substrate 1302. The mask 1306 represents a photolithography mask, such as the mask 606 of FIG. 6.

In FIG. 13B, a deposition of conformal spacer material 1308 over the epitaxial layer 1304 and the mask 1306 is performed. Then, in FIG. 13C, an anisotropic etch (etch back) procedure is performed to leave spacers 1310 on sidewalls of the mask 1306, as shown. Thus, the spacers 1310 illustrate examples of any of the spacers 702, 902, 1102 of FIGS. 7-12, as described above. Width of the spacers 1310 may be controlled by controlling process parameters of the etching process.

Figure 14:
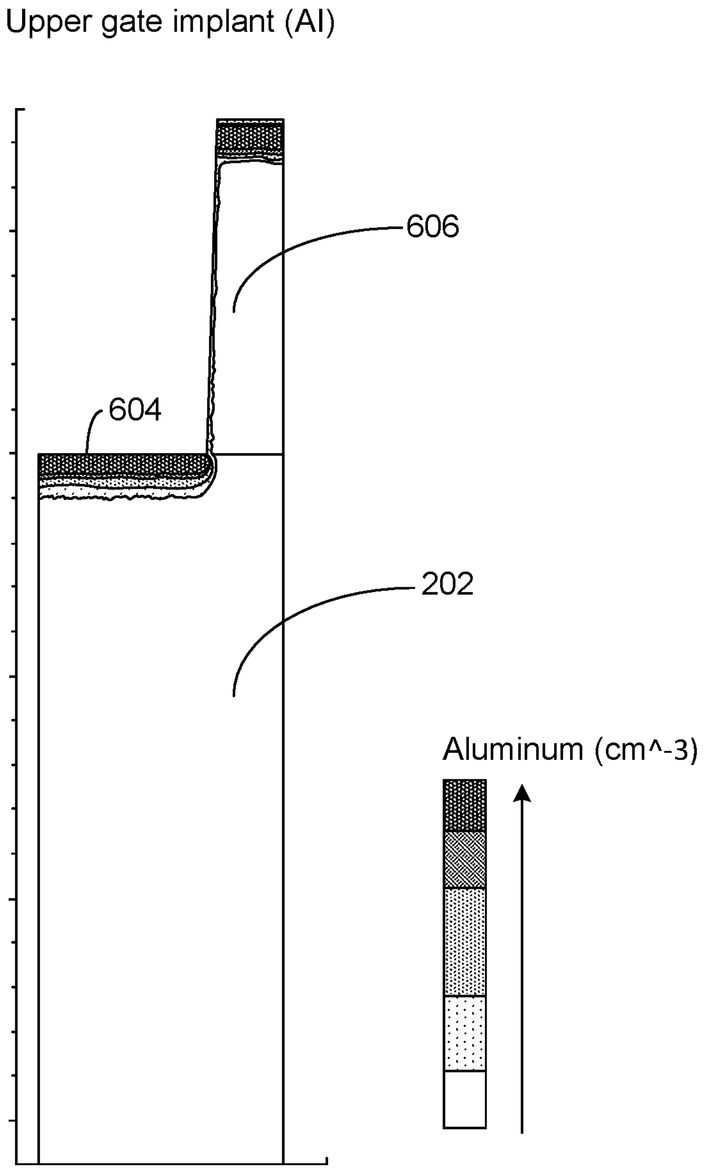
FIG. 14 is a first cross-sectional view of a process modelling of the manufacturing process of FIGS. 6-12, illustrating an upper gate implant process.

FIG. 14 is a first cross-sectional view of a process modelling of the manufacturing process of FIGS. 6-12, illustrating an upper gate implant process. That is, FIG. 14 illustrates a more detailed example of FIG. 6, in which a p-type dopant, e.g., Aluminum (Al) may be used to form the upper gate implant 604, using the mask 606.

Figure 15:
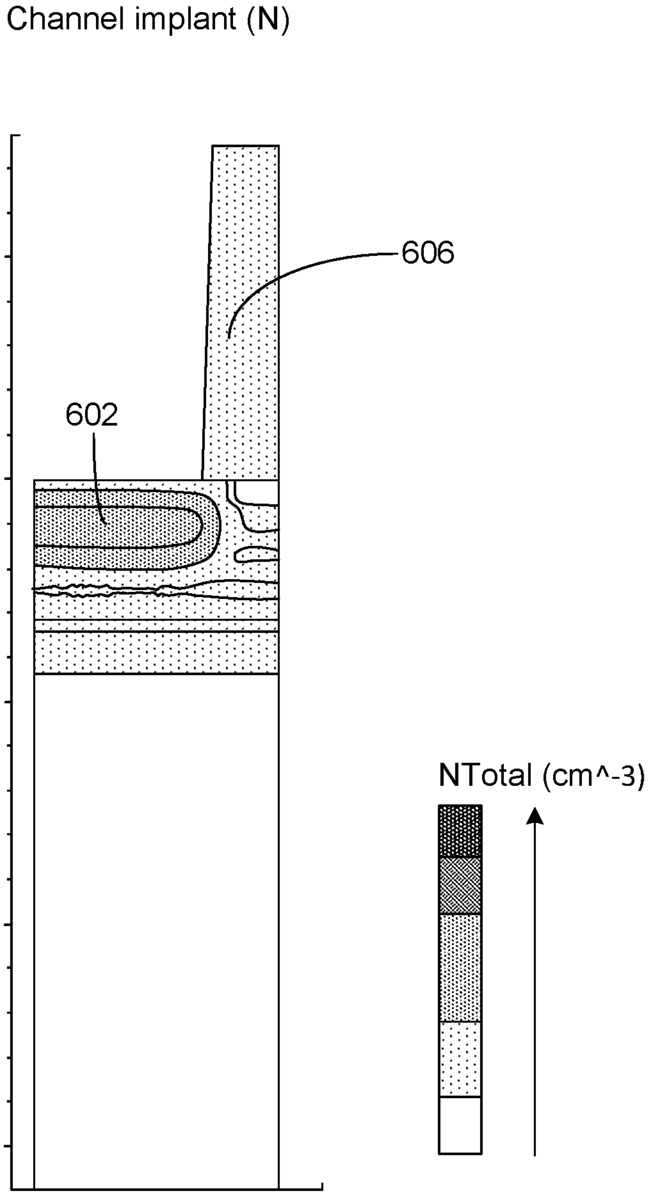
FIG. 15 is a second cross-sectional view of a process modelling of the manufacturing process of FIGS. 6-12, illustrating a channel implant process.

FIG. 15 is a second cross-sectional view of a process modelling of the manufacturing process of FIGS. 6-12, illustrating a channel implant process. FIG. 15 illustrates a more detailed example of FIG. 6, illustrating an example implantation of the channel implant 602.

Figure 16:
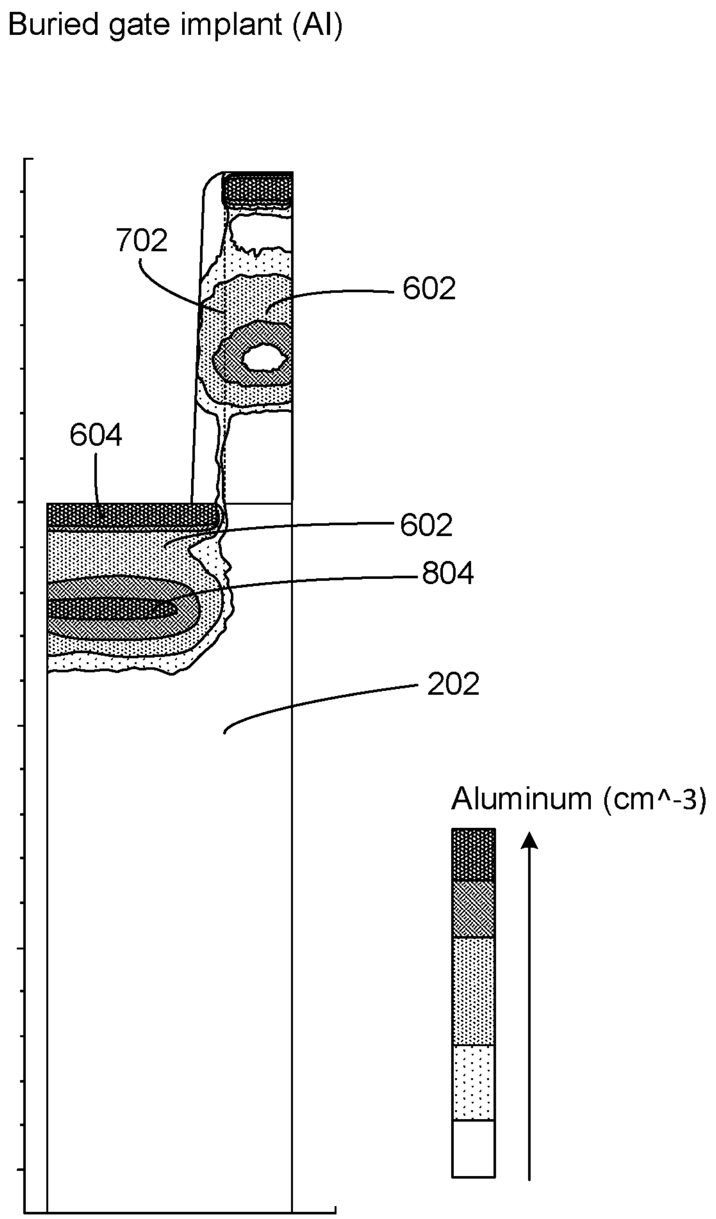
FIG. 16 is a third cross-sectional view of a process modelling of the manufacturing process of FIGS. 6-12, illustrating a lower gate implant process.

FIG. 16 is a third cross-sectional view of a process modelling of the manufacturing process of FIGS. 6-12, illustrating a lower gate implant process. FIG. 16 illustrates a more detailed example of FIGS. 7 and 8, in which spacer 702 is used to form the lower gate implant 804.

Figure 17:
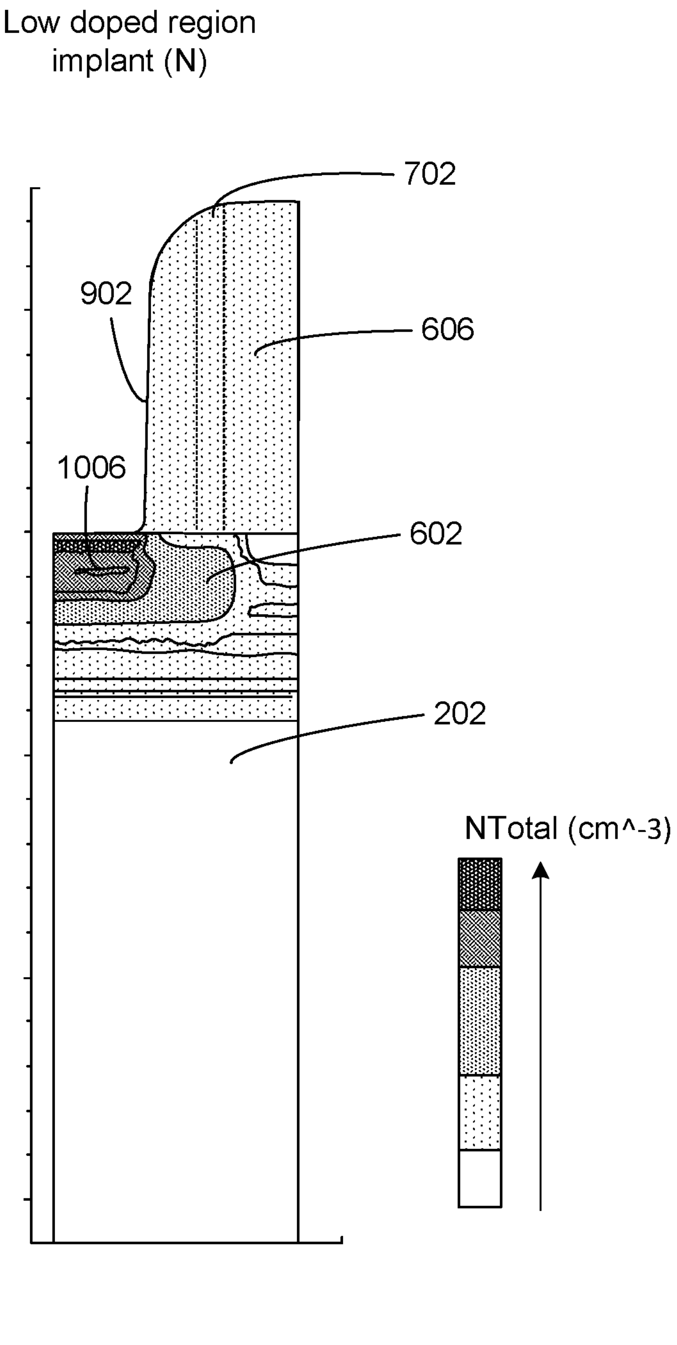
FIG. 17 is a fourth cross-sectional view of a process modelling of the manufacturing process of FIGS. 6-12, illustrating a low-doped region implant process.

FIG. 17 is a fourth cross-sectional view of a process modelling of the manufacturing process of FIGS. 6-12, illustrating a low-doped region implant process. FIG. 17 illustrates a more detailed example of FIGS. 9 and 10, in which spacer 902 is used to form the low-doped region 1006.

Figure 18:
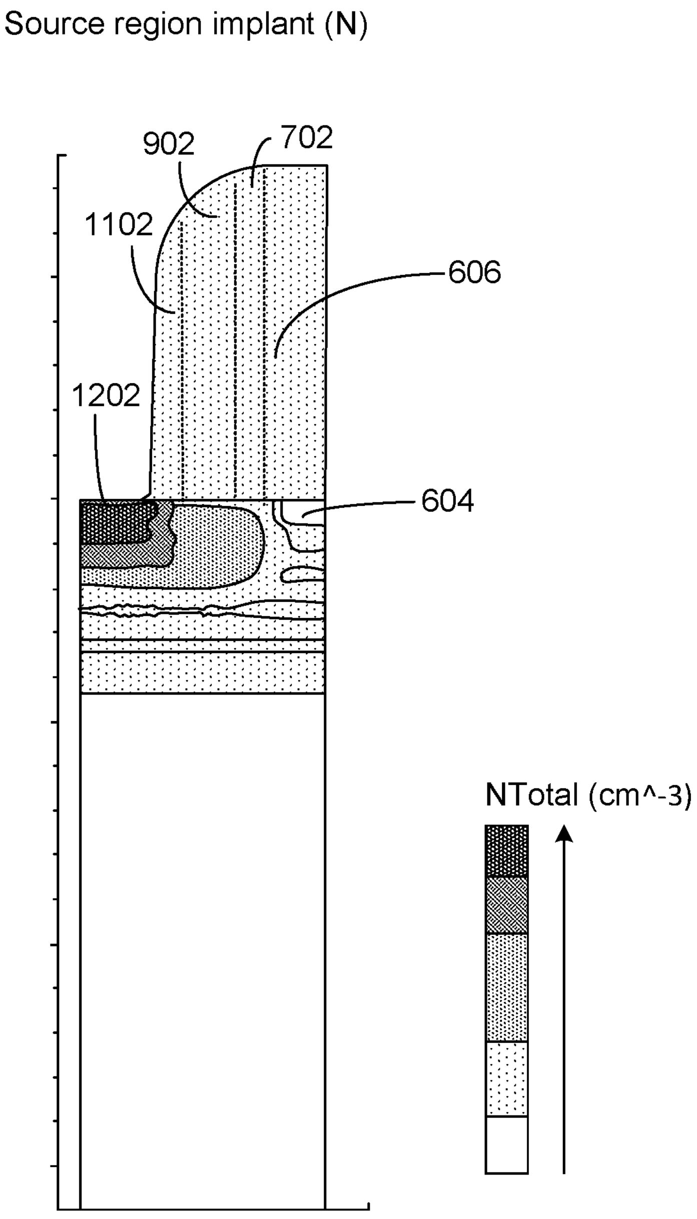
FIG. 18 is a fifth cross-sectional view of a process modelling of the manufacturing process of FIGS. 6-12, illustrating a source region implant process.

FIG. 18 is a fifth cross-sectional view of a process modelling of the manufacturing process of FIGS. 6-12, illustrating a source region implant process. FIG. 18 illustrates a more detailed example of FIGS. 11 and 12, in which spacer 1102 is used to form the source region implant 1202.

Figure 19:
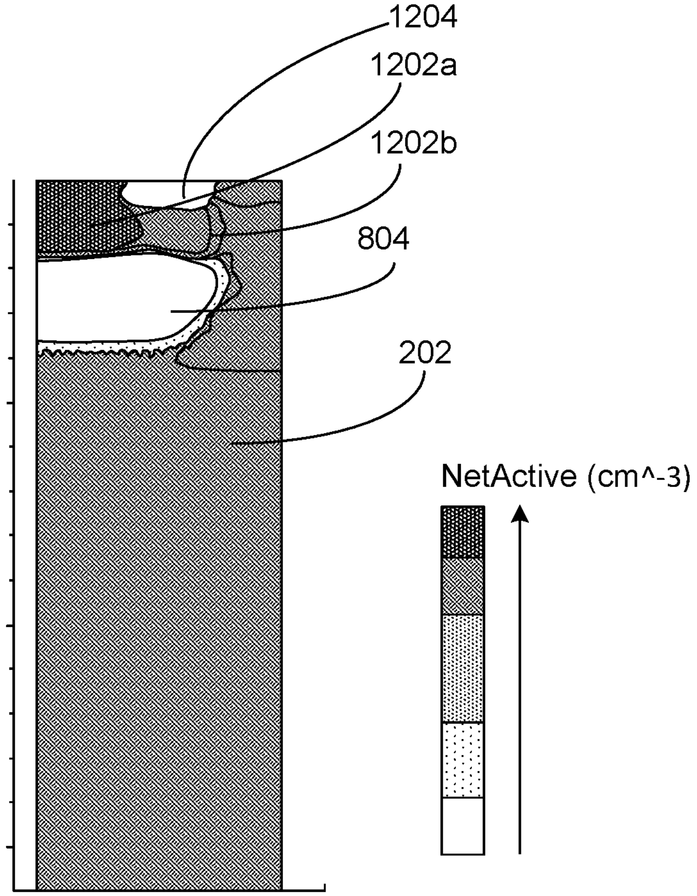
FIG. 19 is a sixth cross-sectional view of a process modelling of the manufacturing process of FIGS. 6-12, illustrating a partially-completed JFET device cell.

FIG. 19 is a sixth cross-sectional view of a process modelling of the manufacturing process of FIGS. 6-12, illustrating a completed JFET device. FIG. 19 illustrates the JFET device with a net active doping.

Figure 20:
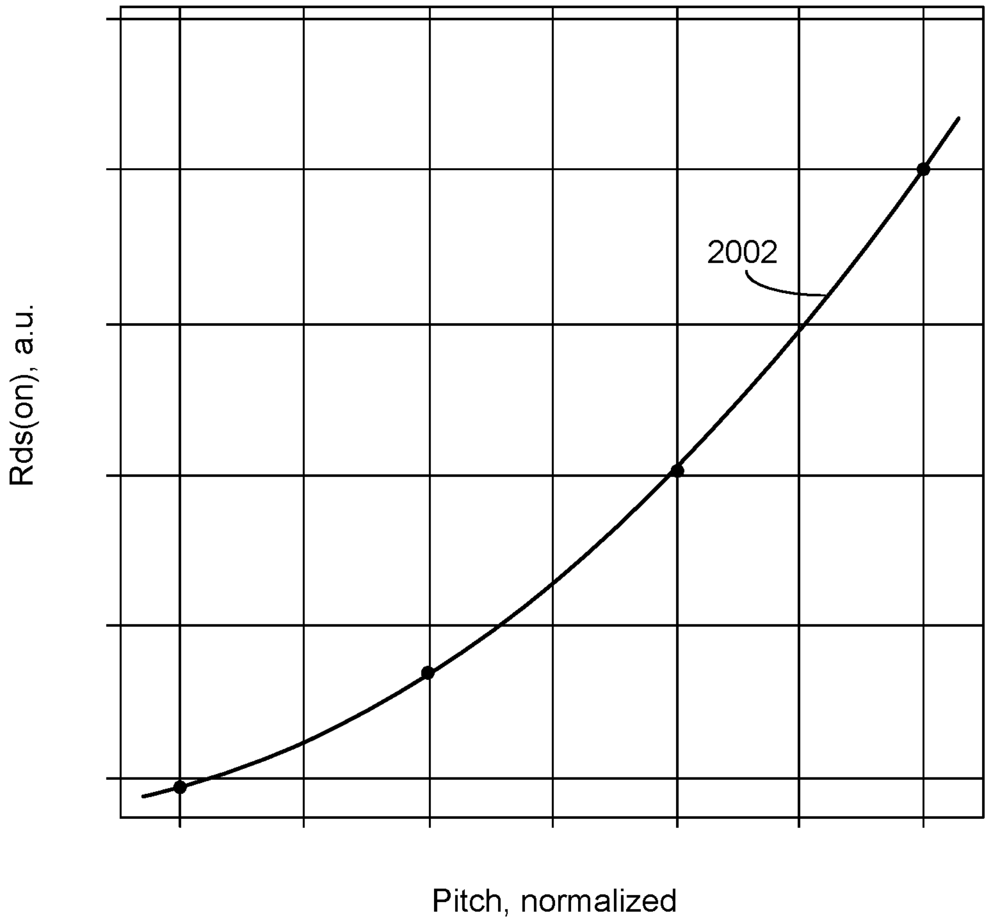
FIG. 20 is a graph illustrating a relationship between device pitch and $R_{DSon}$.

FIG. 20 is a graph illustrating a relationship between device pitch and $R_{DSon}$. As shown by line 2002, decreases in pitch are correlated with decreases in $R_{DSon}$.

Figure 21:
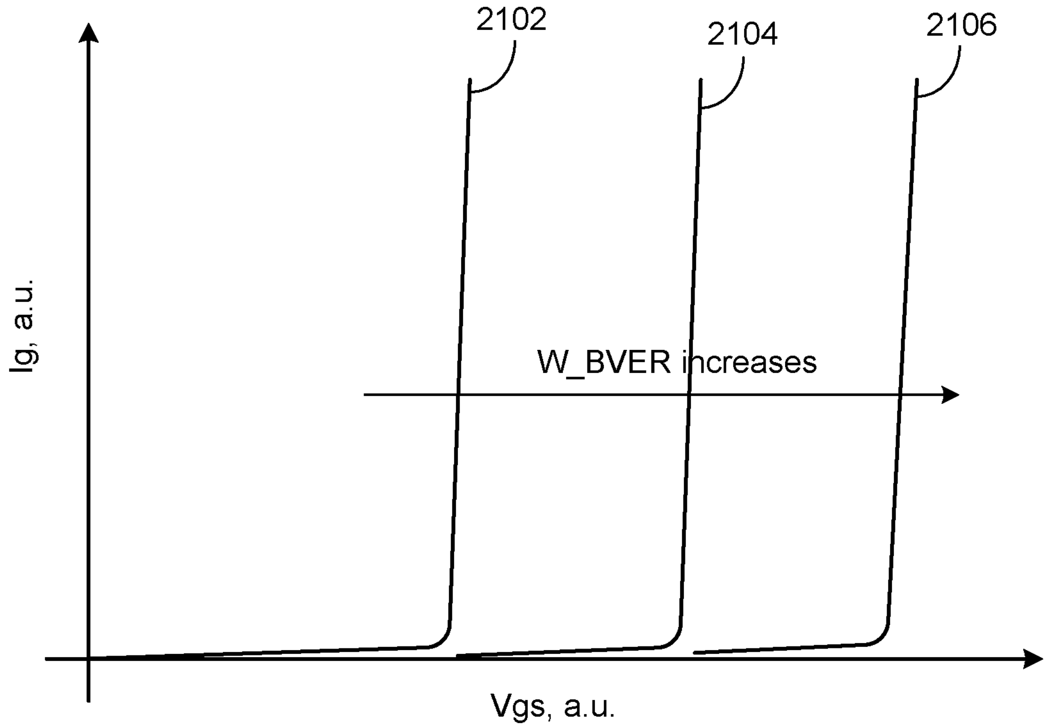
FIG. 21 is a graph illustrating a relationship between gate-source breakdown voltage and a low-doped region of the JFET device of FIG. 1.

FIG. 21 is a graph illustrating a relationship between BVgs and a low-doped region, e.g., BVgs enhancing region 106, of the JFET device of FIG. 1. As shown in FIG. 21, I-V curves 2102, 2104, 2106 illustrate that as a width W_BVER of the BV enhancing region 106 increases, BVgs (e.g., max rating of Vgs) also increases. As referenced above, since the gate contact region 108 and source region 102 are highly doped, direct contact of these regions may result in formation of a pn junction with low BV (e.g., due to tunneling). Consequently, separating these regions by a low-doped region resulting in the illustrated and described BVgs enhancement.

Figure 22A:
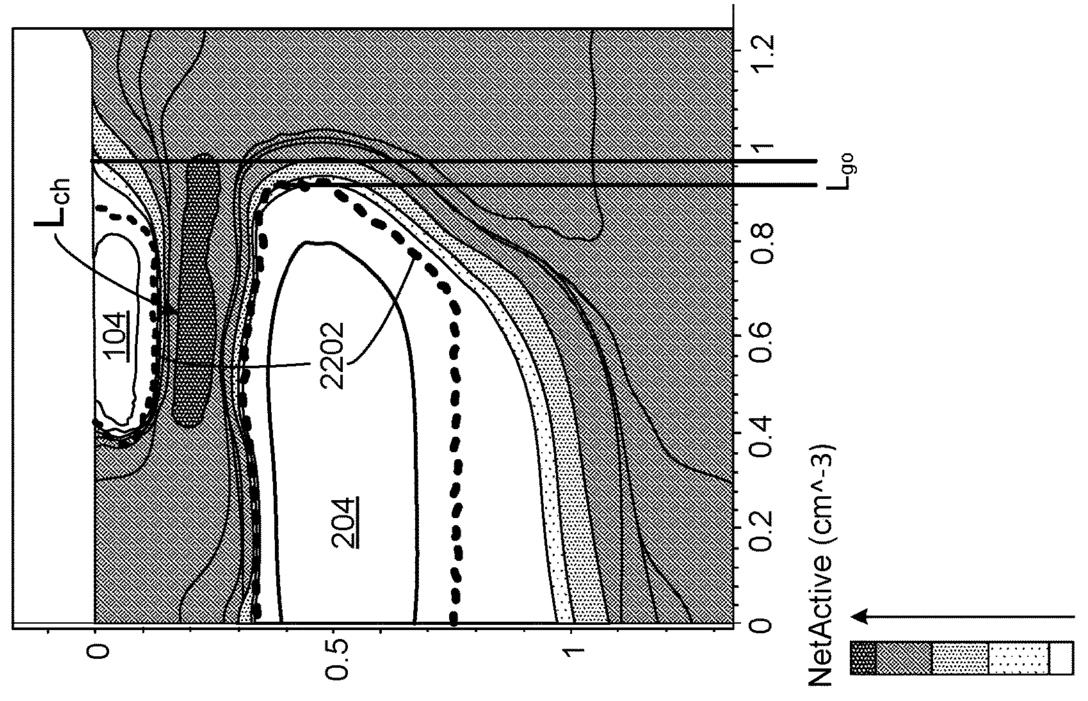
FIGS. 22A and 22B are cross-sectional views of a process modelling of the JFET device of FIGS. 1 and 14, illustrating current flow with and without gate alignment of upper and lower gates.
Figure 22B:
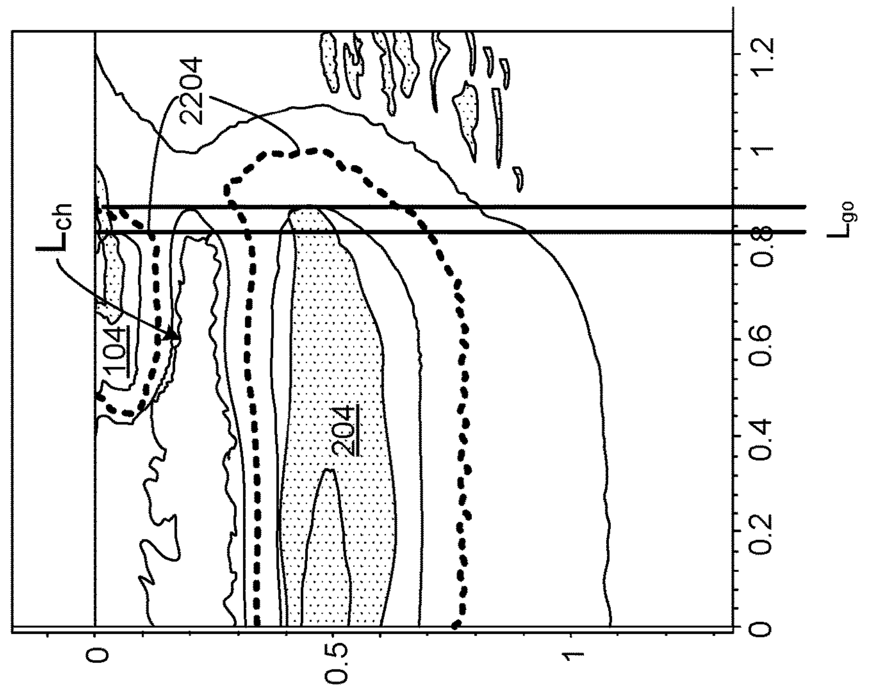

FIGS. 22A and 22B are cross-sectional views of a process modelling of the JFET device of FIGS. 1 and 14, illustrating current flow as a function of gate alignment of upper gate 104 and lower gate 204. Specifically, FIG. 22A illustrates that a sufficient positive gate offset $L_{go}$, in which the upper gate 104 extends laterally beyond the lower gate 204, enables a normally-on JFET operation, with current flow through the current channel $L_{ch}$. As shown, a depletion region(s) 2202 do not extend beyond the channel.

In FIG. 22B, however, when $L_{go}$ is very small or when a negative $L_{go}$ exists (i.e., the lower gate 204 extends laterally beyond the upper gate 104) depletion region 2204 extends beyond the channel region $L_{ch}$. Extension of the depletion region 2204 prevents current flow through the channel $L_{ch}$, causes $R_{DSon}$ to increase, causes the JFET device to turn off, and prevents normally-on operation of the JFET device.

As described herein, normally-on operation of the JFET device may be maintained by forming the lower gate 204 in a manner that maintains a desired gate offset $L_{go}$. For example, with reference to FIGS. 7 and 8, a thickness of the spacer 702 and an energy level of implantation of the lower gate implant 804 may be calibrated to ensure that the gate offset $L_{go}$ is maintained. For example, $L_{go}$ may be maintained at 0.05 microns or less, e.g., at 0.01 microns.

Figure 23:
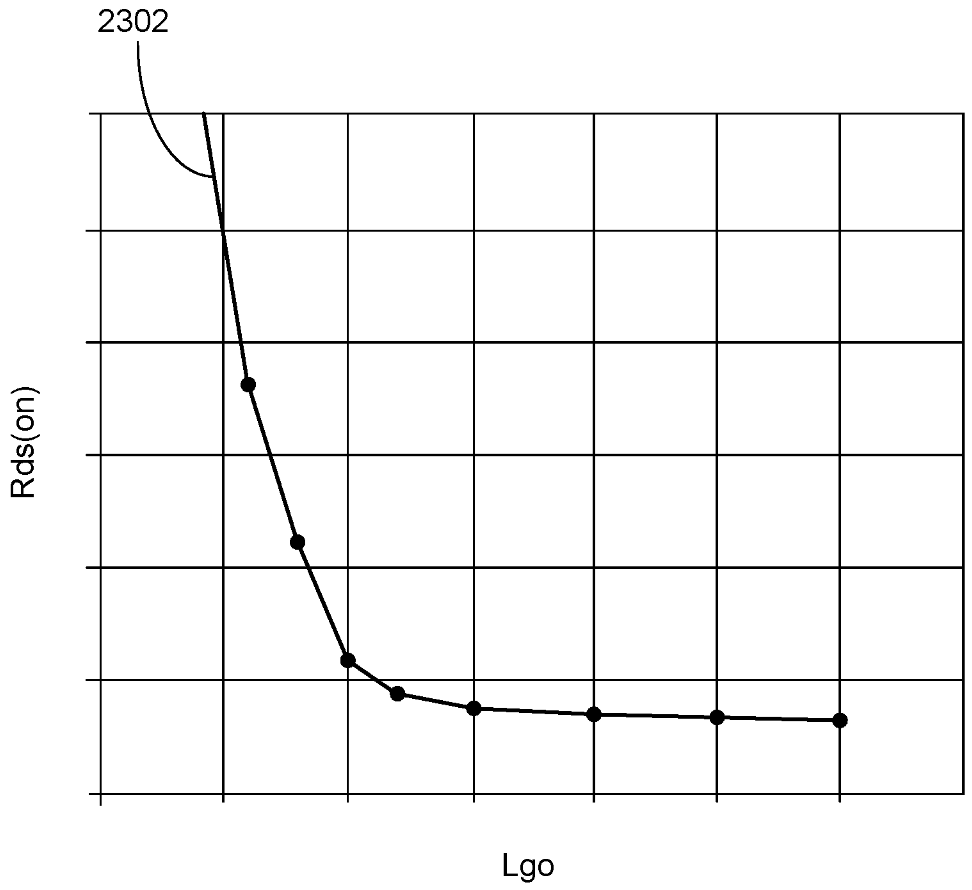
FIG. 23 is a graph illustrating a relationship between upper/lower gate alignment and $R_{DSon}$.

FIG. 23 further illustrates the relationship between $L_{go}$ and $R_{DSon}$. As shown by line 2302, increases in $L_{go}$ cause corresponding decreases in $R_{DSon}$, and corresponding increases in current through the channel $L_{ch}$.

Figure 24:
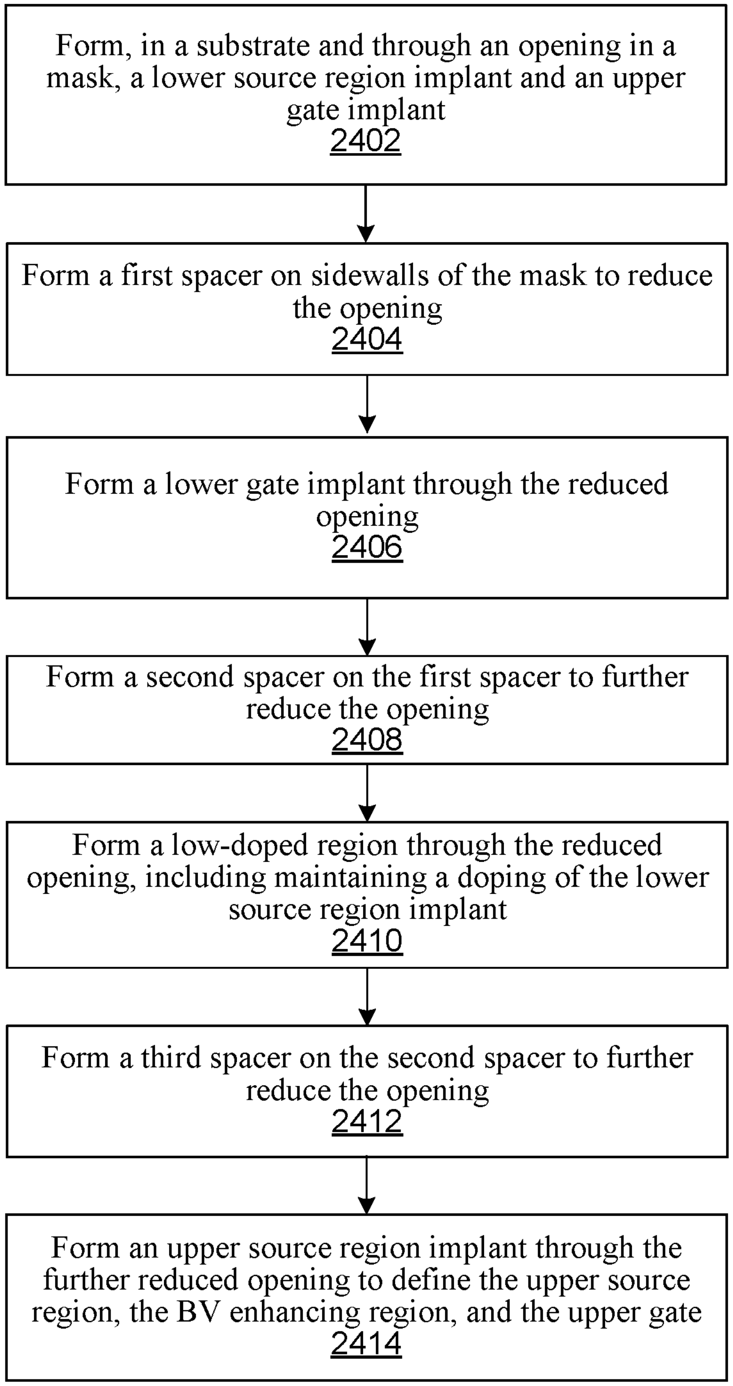
FIG. 24 is a flowchart illustrating example implementations for manufacturing the JFET device described with respect to FIGS. 1-23.

FIG. 24 is a flowchart illustrating example implementations for manufacturing the JFET device described with respect to FIGS. 1-23. In the example of FIG. 24, a lower source region implant (which includes the channel region) and an upper gate implant are formed through a first opening in a mask (2402), disposed on a drift region that is itself disposed on a substrate, as described and illustrated above. A first spacer is formed on sidewalls of the mask to reduce the first opening (2404), i.e., to form a second opening having a reduced size as compared to the first opening. Then, a lower gate implant may be formed through the second opening (2406) and disposed on the drift region, so that the lower source region is disposed on the lower gate implant. As described above, formation (e.g. implantation) of the lower gate implant may be calibrated to ensure maintenance of a desired gate offset $L_{go}$ between the upper gate implant.

A second spacer may be formed on the first spacer to further reduce the opening in size (2408), i.e., to form a third opening. A low-doped region may be formed through the third opening and disposed on the lower source region, while maintaining (e.g., through doping compensation) a doping level of the lower source region implant (2410).

A third spacer may be formed on the second spacer to further reduce the opening in size (2412), i.e., to form a fourth opening. An upper source region implant may formed through the fourth opening to define an upper source region, as well as a BVgs enhancing region and an upper gate that are disposed on the lower source region (2414). That is, the upper gate may be defined as a remainder of the upper gate implant formed through the first opening in operation 2402.

Thus, FIGS. 1-24 illustrate example implementations of a JFET device that includes a plurality of unit cells of individual JFET cells, in which the unit cells are arranged in a grid arrangement, so that lines or segments of unit cells have an alternating gate-source contact layout, and a pitch of the JFET device may be 5 microns or less, e.g., 2 or 3 microns. Such a JFET device may be constructed in a self-aligned manner, in which a spacer formed in one operation may be used as a de facto mask during implantation steps of a subsequent operation.

Many variations of the described embodiments may be provided, as well. For example, the described embodiments include a gate source contact 108 connected to both the upper gate 104 and the lower gate 204, and not to the source region 102. However, other configurations are possible. For example, the lower gate 204 may be connected to the source contact to create an integrated body diode, in which case channel conduction may be controlled entirely by the upper gate 104.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A method of making a semiconductor device, the method comprising:
forming a lower source region implant and an upper gate implant through a first opening in a mask disposed on a substrate;
forming a first spacer on sidewalls of the mask to define a second opening that is smaller than the first opening;
forming a lower gate through the second opening;
forming a second spacer on the first spacer to define a third opening that is smaller than the second opening; and
forming an upper source region through the third opening and within the upper gate implant to thereby define a remainder of the upper gate implant as an upper gate of a Junction Field Effect Transistor (JFET) with the substrate providing a drain of the JFET.

2. The method of claim 1, wherein forming the lower source region implant and the upper gate implant comprises:
forming the lower source region implant under the upper gate implant.

3. The method of claim 1, wherein forming the lower gate through the second opening comprises:
forming the lower gate beneath the lower source region implant with the upper gate implant extending laterally beyond the lower gate to define a gate offset between the upper gate implant and the lower gate.

4. The method of claim 1, further comprising:
forming a third spacer on the first spacer to define a fourth opening having a size that is between sizes of the second opening and the third opening; and
forming a low-doped region through the third opening prior to forming the second spacer.

5. The method of claim 4, wherein forming the upper source region maintains a portion of the low-doped region as a gate-source breakdown voltage (BVgs) enhancing region positioned between the upper source region and the upper gate.

6. A method of making a Junction Field Effect Transistor (JFET) semiconductor device, comprising:
providing a substrate including a drain region of the JFET semiconductor device;
providing a drift region on the substrate;
providing a lower source region through a first opening defined by a mask;
forming a spacer on sidewalls of the mask to define a second opening that is smaller than the first opening;
providing a lower gate on the drift region through the second opening,
wherein the lower source region is disposed on the lower gate and extends laterally beyond the lower gate;
providing an upper source region disposed on the lower source region, with the lower source region extending laterally beyond the upper source region; and
providing an upper gate formed on the lower source region and at least partially surrounding the upper source region, and extending laterally beyond the lower gate to define a gate offset between the upper gate and the lower gate.

7. The method of claim 6, further comprising:
providing a gate contact region that is in contact with the upper gate and the lower gate to provide a common gate contact for the JFET semiconductor device.

8. The method of claim 7, wherein a channel length of the JFET semiconductor device is defined in the lower source region as an overlap of an outer edge of the lower gate and an inner edge of the upper gate.

9. The method of claim 8, further comprising:
forming the gate contact region partially overlapped with the upper gate by a distance that is less than the channel length.

10. The method of claim 7, further comprising:
forming the gate contact region partially overlapped with the lower source region.

11. The method of claim 6, further comprising:
providing a gate-source breakdown voltage (BVgs) enhancing region on the lower source region and disposed between the upper source region and the upper gate.

12. The method of claim 11, wherein the BVgs enhancing region has a doping level that is twenty percent or less of a doping level of the upper source region.

13. The method of claim 6, wherein the substrate and the drift region comprise Silicon Carbide (SiC).

14. The method of claim 6, wherein the gate offset is 0.05 microns or less.

15. The method of claim 6, wherein the JFET semiconductor device is normally on.

16. The method of claim 6, wherein providing the upper source region comprises:
forming a second spacer on the spacer to define a third opening that is smaller than the second opening; and
providing the upper source region through the third opening.

17. A method of making a Junction Field Effect Transistor (JFET) semiconductor device, comprising:
providing a substrate including a drain region of the JFET semiconductor device;
providing a drift region on the substrate; and
providing a plurality of unit cells on the drift region in a grid, including, for each unit cell:
providing a source region having a lower source region through a first opening defined by a mask, and an upper source region disposed on the lower source region, with the lower source region extending laterally beyond the upper source region;
forming a spacer on sidewalls of the mask to define a second opening that is smaller than the first opening;
providing a lower gate on the drift region through the second opening, with the lower source region disposed on the lower gate and extending laterally beyond the lower gate; and
providing an upper gate formed on the lower source region and at least partially surrounding the upper source region, and extending laterally beyond the lower gate to define a gate offset between the upper gate and the lower gate.

18. The method of claim 17, wherein a pitch of the JFET semiconductor device defined between adjacent unit cells is 5 microns or less.

19. The method of claim 17, wherein each unit cell includes a gate-source breakdown voltage (BVgs) enhancing region formed on the lower source region and between the upper source region and the upper gate.

20. The method of claim 17, wherein the gate offset is 0.05 microns or less.

21. The method of claim 17, further comprising:

providing each unit cell with a gate contact region that is in contact with the upper gate and the lower gate to provide a common gate contact for the JFET semiconductor device.

22. The method of claim 17, wherein providing the source region comprises:

forming a second spacer on the spacer to define a third opening that is smaller than the second opening; and providing the upper source region through the third opening.

* * * * *